United States Patent
Chen et al.

(10) Patent No.: US 11,740,558 B2
(45) Date of Patent: Aug. 29, 2023

(54) PHOTORESIST BAKING APPARATUS WITH COVER PLATE HAVING UNEVEN EXHAUST HOLE DISTRIBUTION

(71) Applicant: Taiwan Semiconductor Manufacturing Company, Ltd., Hsinchu (TW)

(72) Inventors: Po-Hung Chen, Kaohsiung (TW); Yu-Kai Chen, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/852,632

(22) Filed: Jun. 29, 2022

(65) Prior Publication Data

US 2022/0326619 A1    Oct. 13, 2022

Related U.S. Application Data

(63) Continuation of application No. 17/369,001, filed on Jul. 7, 2021, now Pat. No. 11,392,039, which is a continuation of application No. 16/881,221, filed on May 22, 2020, now Pat. No. 11,067,897.

(51) Int. Cl.
*G03F 7/40* (2006.01)

(52) U.S. Cl.
CPC ..................... *G03F 7/40* (2013.01)

(58) Field of Classification Search
CPC ... G03F 7/40; G03F 7/168; G03F 7/38; H01L 21/67109; H01L 21/6875; H01L 21/6715
See application file for complete search history.

(56) References Cited

U.S. PATENT DOCUMENTS

| 7,050,710 | B2 | 5/2006 | Shinya et al. |
| 8,587,763 | B2 | 11/2013 | Otsuka |
| 11,067,897 | B1 | 7/2021 | Chen et al. |
| 11,392,039 | B2 * | 7/2022 | Chen ................. H01L 21/6875 |
| 2006/0032072 | A1 | 2/2006 | Yamaga et al. |
| 2008/0237214 | A1 | 10/2008 | Scheer et al. |
| 2018/0355481 | A1 | 12/2018 | Kang et al. |
| 2020/0133128 | A1 * | 4/2020 | Kuo ................. H01L 21/67103 |
| 2020/0402866 | A1 * | 12/2020 | Lee ......................... H01L 22/20 |
| 2021/0003922 | A1 * | 1/2021 | Wang ................. H01L 21/0273 |

FOREIGN PATENT DOCUMENTS

| JP | 2003-159558 A | 6/2003 |
| TW | 561511 B | 11/2003 |

OTHER PUBLICATIONS

Chinese language office action dated Mar. 31, 2022, issued in application No. TW 110116719.

* cited by examiner

*Primary Examiner* — Hung V Nguyen
*Assistant Examiner* — Hung Henry Nguyen
(74) *Attorney, Agent, or Firm* — McClure, Qualey & Rodack, LLP

(57) ABSTRACT

A photoresist baking apparatus is provided. The photoresist baking apparatus includes a baking chamber, a hot plate disposed in the baking chamber, and a cover plate disposed over the hot plate. The cover plate has a plurality of exhaust holes. The exhaust holes include a first exhaust hole and a second exhaust hole arranged in a first direction. The first exhaust hole and the second exhaust hole have different sizes.

20 Claims, 4 Drawing Sheets

PHOTORESIST BAKING APPARATUS WITH COVER PLATE HAVING UNEVEN EXHAUST HOLE DISTRIBUTION

CROSS REFERENCE TO RELATED APPLICATIONS

This application is a Continuation Application of U.S. patent application Ser. No. 17/369,001, filed on Jul. 7, 2021, which is a Continuation Application of U.S. application Ser. No. 16/881,221 filed on May 22, 2020 issued to be U.S. Pat. No. 11,067,897 on Jul. 20, 2021, the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate (e.g., a wafer), and patterning the various material layers using lithography to form circuit components and elements thereon.

Photolithography or lithography is a process that produces circuit patterns on a surface of a wafer using light-sensitive photoresist material and controlled exposure to light. Applying and developing the photoresist involves several heating steps that are performed within an enclosed chamber of a wafer track system. The wafer is heated on a hot plate and air flows through the chamber to ensure film uniformity over the wafer and to blow out the evaporated solvent coming from the photoresist.

Although existing photoresist baking apparatuses have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
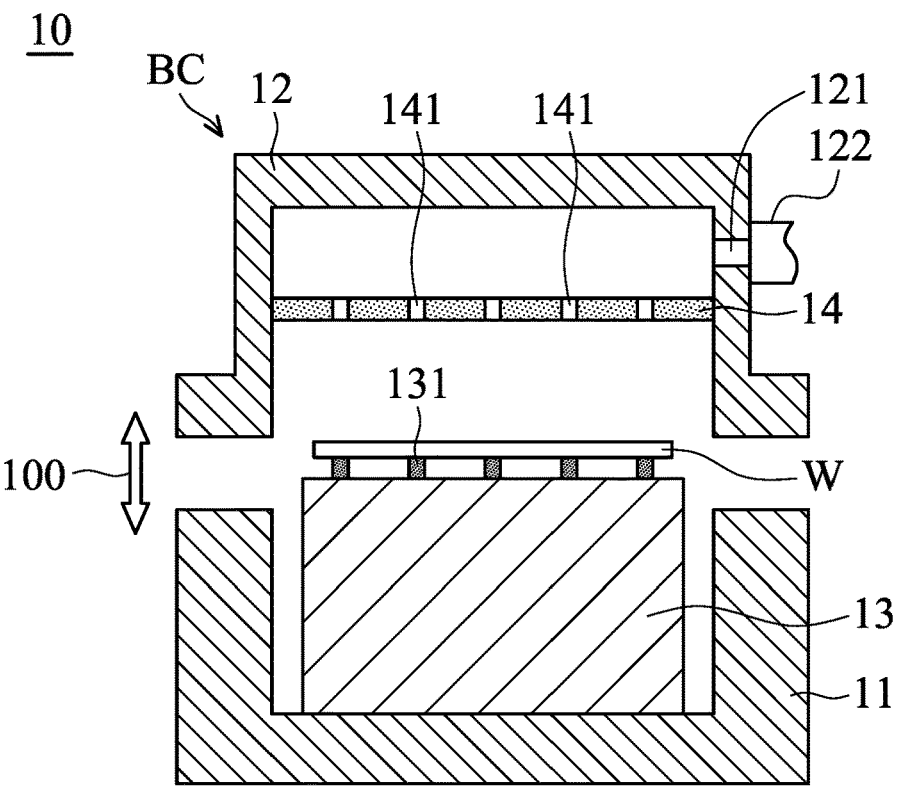
FIG. 1A is a schematic cross-sectional view of a photoresist baking apparatus in a state where the baking chamber is opened, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms such as "substantially parallel" or "substantially perpendicular" in the description are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Moreover, although the terms first, second, third, fourth etc. may be used in the following detailed description to describe various elements, regions or sections, these elements, regions or sections should not be limited by these terms. These terms are only used to distinguish one element, region or section from another element, region or section. Thus, a first element, region or section discussed below could be termed a second element, region or section without departing from the teachings of the present invention.

FIG. 1A is a schematic cross-sectional view of a photoresist baking apparatus 10, also called an oven, for use in semiconductor manufacture, in accordance with some embodiments. Some variations of the embodiments will be described. It should be understood that the materials, geometries, structures, and processes described herein are only illustrative, and are not intended to be, and should not be constructed to be, limiting to the present disclosure. Many alternatives and modifications will be apparent to those skilled in the art, once informed by the present disclosure.

Figure 1B:
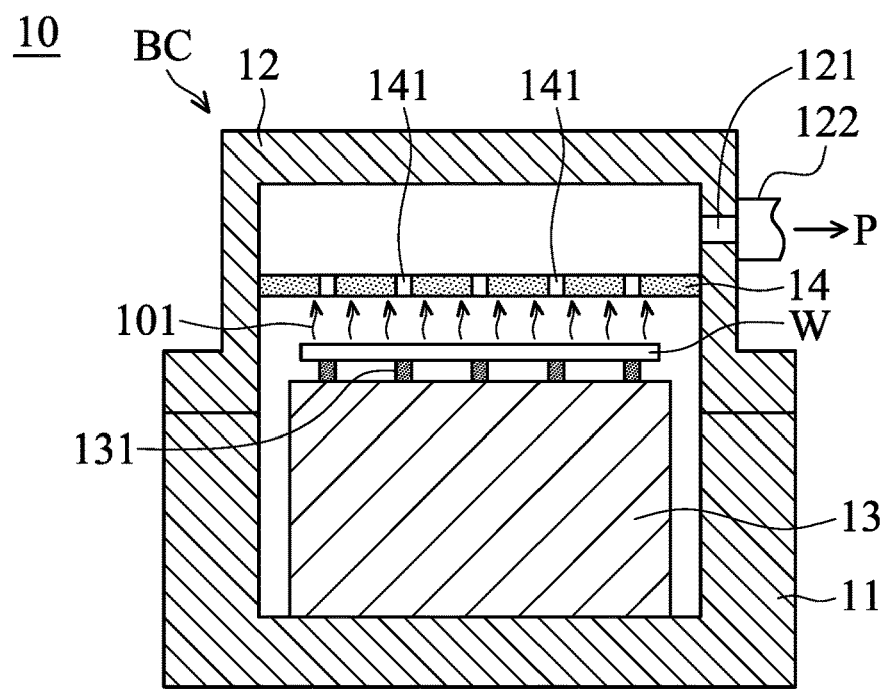
FIG. 1B is a schematic cross-sectional view of a photoresist baking apparatus in a state where the baking chamber is closed, in accordance with some embodiments.

Referring to FIG. 1A, the photoresist baking apparatus 10 includes a baking chamber BC comprising a lower chamber portion 11 and an upper chamber portion 12. In some embodiments, the upper chamber portion 12 is vertically movable in a direction 100 to open and close the baking chamber BC in which a photoresist baking process can be performed (to be described later). In operation, the upper chamber portion 12 is moved vertically down towards the lower chamber portion 11 until the baking chamber BC is enclosed, as shown in FIG. 1B. Although not shown, a drive mechanism is coupled to the upper chamber portion 12 to allow vertical movement. Alternatively, the upper chamber portion 12 may be hinged to the lower chamber portion 11 to allow opening and closing of the baking chamber BC, in some other embodiments. The shape and size of the baking chamber BC may vary depending on the actual requirements (e.g., the shape or size of a workpiece to be processed). For example, the baking chamber BC may be a hollow cylinder or cuboid having a certain capacity to accommodate a 100 mm, 150 mm, 200 mm, 300 mm, 450 mm, or even a larger wafer.

Referring to FIG. 1A, a hot plate 13 is disposed in the baking chamber BC. The lower chamber portion 11 houses or supports the hot plate 13. The hot plate 13 may be used for heat treating a wafer W during several processing steps of semiconductor manufacture. In the present embodiment, the wafer W is a semiconductor wafer made of silicon or other semiconductor materials. Alternatively or additionally, the wafer W may include other elementary semiconductor materials such as germanium (Ge) or the like. In some embodiments, the wafer W is made of a compound semiconductor such as silicon carbide (SiC), gallium arsenic (GaAs), indium arsenide (InAs), indium phosphide (InP) or the like. In some other embodiments, the wafer W is made of an alloy semiconductor such as silicon germanium (SiGe), silicon germanium carbide (SiGeC), gallium arsenic phosphide (GaAsP), gallium indium phosphide (GaInP) or the like. In some other embodiments, the wafer W is a silicon-on-insulator (SOI) or a germanium-on-insulator (GOI) substrate.

In addition, the wafer W may have various device elements. Examples of device elements that are formed in the wafer W include transistors (e.g., metal oxide semiconductor field effect transistors (MOSFET), complementary metal oxide semiconductor (CMOS) transistors, bipolar junction transistors (BJT), high voltage transistors, high-frequency transistors, p-passage and/or n-passage field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the wafer W includes a photoresist material or a bottom antireflective coating (BARC) film that has been applied to the surface of the wafer W by a method such as spin-coating. In some embodiments, the wafer W may undergo a pre-bake (also called soft bake) process using the hot plate 13, after the photoresist or BARC film has been applied to the wafer surface. The pre-bake process is performed to evaporate most of the solvent in the photoresist or BARC film. Alternatively, the wafer W may undergo other heat treatments using the hot plate 13, such as a post exposure bake (PEB), a post developer bake (PDB), a top antireflective coating (TARC) treatment, an immersion top coating (ITC) or SOAK treatment, an HMDS adhesion priming treatment, or any other treatments known in the art.

In operation, the wafer W may be placed on a plurality of protrusions 131 on the surface of the hot plate 13 and held in place by a vacuum (not shown). In some other embodiments, the protrusions 131 are omitted and the wafer W can be placed directly on and in contact with the surface of the hot plate 13. The hot plate 13 may be heated to a target temperature which is dependent on the type of film material being heat treated.

For example, the target temperature of the hot plate 13 for photoresist material is between about 90 to 130 degree Celsius (° C.) and for BARC film is between about 205 to 215° C. The heat generated by the hot plate 13 is conducted through contact with the backside of the wafer W and to the photoresist or BARC film on the surface of the wafer W. As stated above, the pre-bake evaporates the solvent of the photoresist or BARC film. As the photoresist or BARC film reaches its glass transition temperature (Tg), the solvent molecules become more mobile and diffuse upwards accumulating at the film surface. As the temperature of the film continues to rise, the solvent molecules start to evaporate 101 and move towards an exhaust port 121 of the baking chamber BC.

Alternatively, the target temperature of the hot plate 13 for the post exposure bake (PEB) is between about 90 to 115° C., for the post developer bake (PDB) is between about 90 to 115° C., for the top antireflective coating (TARC) treatment is between about 90 to 115° C., for the immersion top coating (ITC) or SOAK treatment is between about 90 to 115° C., and for the HMDS adhesion priming treatment is between about 100 to 120° C. It should be understood that the target temperatures of the hot plate 13 described herein are only illustrative, and are not intended to be, and should not be constructed to be, limiting to the present disclosure. Other values can also be used in different embodiments.

As shown in FIG. 1B, the exhaust port 121 is located on a sidewall of the upper chamber portion 12 and above the hot plate 13, in some embodiments. The upper chamber portion 12 further includes an exhaust line 122 coupled to the exhaust port 121. The exhaust line 122 may be configured to draw out or exhaust the atmosphere (i.e., hot air) inside the baking chamber BC (as indicated by the arrow P in FIG. 1B) by being connected to a pump (not shown). As such, the exhaust line 122 allows the evaporated solvent 101 to be exhausted out of the baking chamber BC and secures a contamination-free environment for the baking chamber BC.

The pumping pressure of the exhaust line 122 may vary depending on the actual requirements (e.g., the volume of the hot air generated during the photoresist baking process). Generally, the greater the volume of the hot air generated, the higher the pumping pressure of the exhaust line 122. In some embodiments, the pumping pressure of the exhaust line 122 is about 1.4 kpa. In some embodiments, the pumping pressure of the exhaust line 122 is in a range from about 1.4 to 1.7 kpa. In some embodiments, the pumping pressure of the exhaust line 122 is in a range from about 1.7 to 4.2 kpa. However, other values can also be used in different embodiments.

In some embodiments, the photoresist baking apparatus 10 further includes a cover plate 14 disposed in the baking chamber BC, as shown in FIG. 1B. The cover plate 14 is substantially a plate-like structure having a plurality of exhaust holes 141 distributed over the entire plate to allow air to flow through. In some cases, the thickness of the cover plate 14 is about 2 mm, but the disclosure is not limited thereto. As shown in FIG. 1B, the cover plate 14 is positioned over the hot plate 13 and between the hot plate 13 and the exhaust port 121 (which is located near one side of the cover plate 14), in some embodiments. The cover plate 14 may be removably fixed to the inner wall of the upper chamber portion 12 through several fasteners (e.g., screws). In some embodiments, the shape of the cover plate 14 corresponds to the shape of the baking chamber BC. For example, when the baking chamber BC is a hollow cuboid, the cover plate 14 can be a rectangular plate (when viewed in a direction perpendicular to its top surface) accordingly. However, embodiments of the disclosure are not limited to these shapes, and other shapes can also be used.

The cover plate 14 may be made of or include one or more metal materials that can withstand the heat generated during the photoresist baking process described above. The metal material(s) may include iron, aluminum, copper, titanium, silver, platinum, one or more other suitable metal materials, alloys thereof, or a combination thereof. The exhaust holes 141 may be formed using a laser beam drilling process, a mechanical drilling process, one or more other applicable processes, or a combination thereof.

The use of the cover plate 14 in cooperation with the exhaust line 122 allows air to flow evenly throughout the baking chamber BC which provides for a uniform film topography on the wafer W surface. However, it has been observed that photoresist volatiles (i.e., the evaporated solvent 101) are easily condensed at certain locations on the cover plate 14 and will block some exhaust holes 141 away from the exhaust port 121. In addition, the photoresist volatiles may fall back onto the wafer W during processing, which may cause wafer defects. Therefore, the cover plate 14 needs to be cleaned regularly, thereby wasting manpower and reducing productivity.

Figure 2:
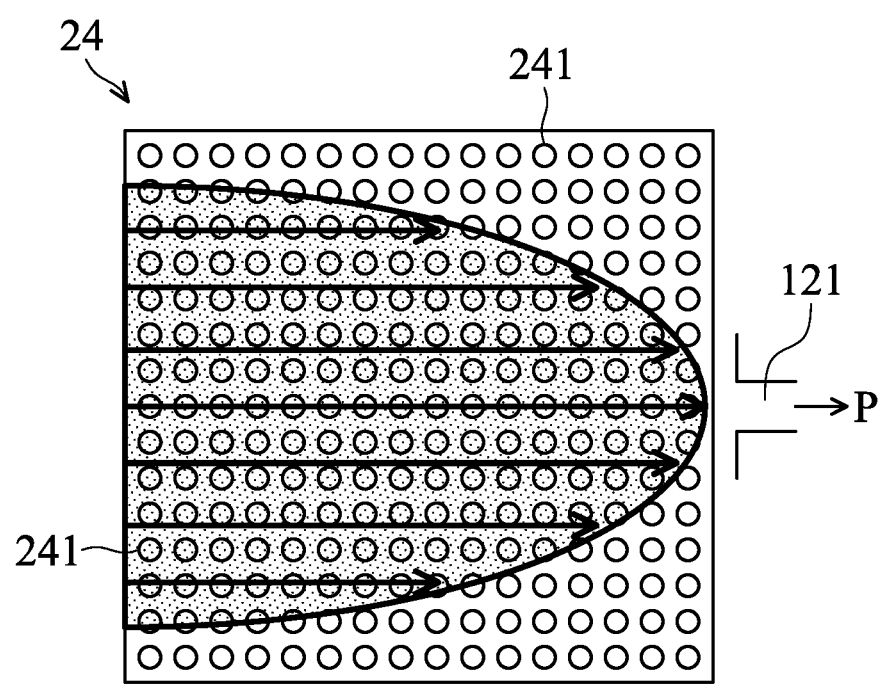
FIG. 2 schematically shows an uneven wind speed distribution of an exhaust flow for a cover plate having an even exhaust hole distribution when the exhaust port is located near one side of the cover plate.

The applicants have found that the exhaust port 121 located near one side of the cover plate 14 would cause an uneven exhaust flow field distribution for the cover plate 14. For example, referring to FIG. 2, which schematically shows an uneven wind speed distribution (e.g., distributed as parabola) of an exhaust flow for a cover plate 24 having an even exhaust holes 241 distribution (i.e., the exhaust holes 241 throughout the cover plate 24 have the same size and consistent hole pitch) when the exhaust port 121 is located near one side of the cover plate 24. This is because the exhaust holes 241 closer to the exhaust port 121 will receive more suction force, and the exhaust holes 241 farther from the exhaust port 121 will receive less suction force. As a result, photoresist volatiles cannot be taken away smoothly by the airflow and will block some exhaust holes 241, wherein these exhaust holes 241 are farther from the exhaust port 121 and therefore receive less suction force.

Figure 3:
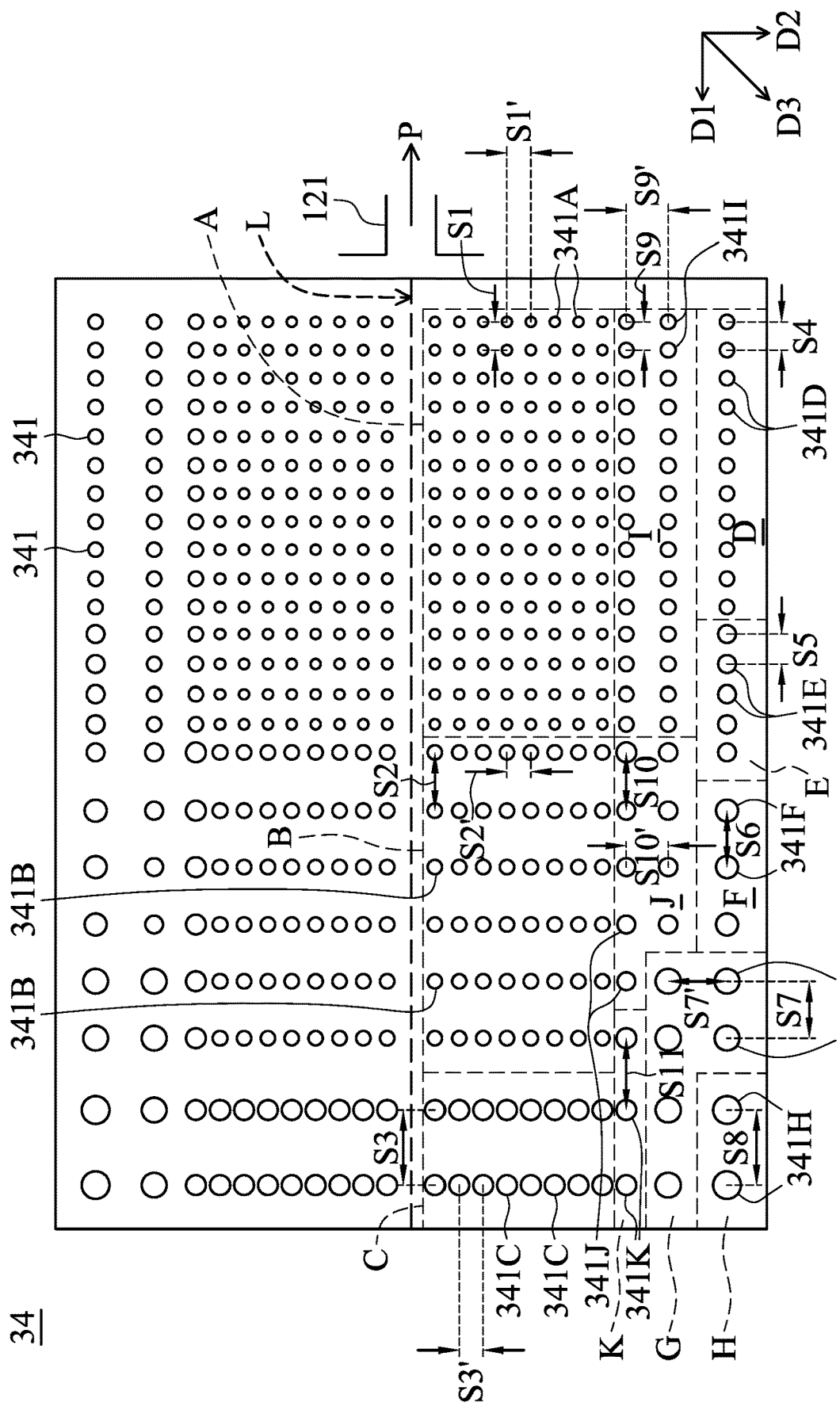
FIG. 3 is a schematic top view of a cover plate with an uneven exhaust hole distribution, in accordance with some embodiments.

FIG. 3 is a schematic top view of a cover plate 34 for facilitating a more uniform exhaust flow field distribution, in accordance with some embodiments. The cover plate 34 may be disposed in the baking chamber BC of the photoresist baking apparatus 10 in a similar manner to the cover plate 14 illustrated in FIG. 1B. Also, the structure, materials, and formation method of the cover plate 34 may be the same or similar to those of the cover plate 14 illustrated in FIG. 1B. The cover plate 34 improves the uniformity of the wind speed of the exhaust holes 341 through an uneven exhaust hole distribution as described below.

As shown in FIG. 3, the cover plate 34 is a rectangular plate (when viewed in a direction perpendicular to its top surface) and has a center line L that is parallel to the exhaust direction P of the exhaust line 122 (as well as the first direction D1 shown in FIG. 3). In some embodiments, the location of the exhaust port 121 is aligned with the center line L of the cover plate 34 (when viewed in a direction perpendicular to its top surface), and the exhaust holes 341 throughout the cover plate 34 are symmetrically arranged with respect to the center line L, as shown in FIG. 3.

In some embodiments, the exhaust holes 341 on the cover plate 34 are arranged in a matrix. For example, the exhaust holes 341 are arranged in an array of orthogonal rows and columns, wherein the exhaust holes 341 of each row are arranged in a direction parallel to the first direction D1 shown in FIG. 3, and the exhaust holes 341 of each column are arranged in a direction parallel to the second direction D2 shown in FIG. 3. The exhaust holes 341 either in the first direction D1 (parallel to the exhaust direction P) or second direction D2 (perpendicular to the exhaust direction P) may have different sizes (e.g., diameter) and/or hole pitches (e.g., distance between hole centers of adjacent exhaust holes) according to the distance to the exhaust port 121, in some embodiments.

For illustration, the following description refers only to the exhaust holes 341 on one side of the center line L of the cover plate 34 due to symmetrical arrangement of the exhaust holes 341 with respect to the center line L.

As shown in FIG. 3, the exhaust holes 341 comprise a set of first exhaust holes 341A having the same size in a region A of the cover plate 34, a set of second exhaust holes 341B having the same size in a region B of the cover plate 34, and a set of third exhaust holes 341C having the same size in a region C of the cover plate 34, in some embodiments. The three regions A, B and C are arranged in the first direction D1 and close to the center line L of the cover plate 34. In addition, the regions A, B and C are arranged in sequence in the direction away from the exhaust port 121.

In some embodiments, the size of each third exhaust hole 341C in the region C is larger than the size of each second exhaust hole 341B in the region B, and the size of each second exhaust hole 341B in the region B is larger than the size of each first exhaust hole 341A in the region A, as shown in FIG. 3.

For example, the size of each third exhaust hole 341C may be about 9 mm, the size of each second exhaust hole 341B may be about 6 mm, and the size of each first exhaust hole 341A may be about 3 mm, in some cases where the pumping pressure of the exhaust line 122 is about 1.4 kpa. Alternatively, the size of each third exhaust hole 341C may be about 11 mm, the size of each second exhaust hole 341B may be about 7.2 mm, and the size of each first exhaust hole 341A may be about 3.5 mm, in some cases where the pumping pressure of the exhaust line 122 is in a range from about 1.4 to 1.7 kpa. Alternatively, the size of each third exhaust hole 341C may be about 15.3 mm, the size of each second exhaust hole 341B may be about 10.2 mm, and the size of each first exhaust hole 341A may be about 5 mm, in some cases where the pumping pressure of the exhaust line 122 is in a range from about 1.7 to 4.2 kpa.

In some embodiments, the first exhaust holes 341A in the region A have a uniform (hole) pitch S1 between adjacent first exhaust holes 341A in the first direction D1, the second exhaust holes 341B in the region B have a uniform (hole) pitch S2 between adjacent second exhaust holes 341B in the first direction D1, and the third exhaust holes 341C in the region C have a uniform (hole) pitch S3 between adjacent third exhaust holes 341C in the first direction D1, as shown in FIG. 3. The pitch S1 is smaller than the pitch S2, and the pitch S2 is smaller than the pitch S3. For example, the pitch S1 may be about 12 mm, the pitch S2 may be about 24 mm, and the pitch S3 may be about 36 mm, in some cases.

As shown in FIG. 3, the exhaust holes 341 further comprise a set of fourth exhaust holes 341D having the same size in a region D of the cover plate 34, a set of fifth exhaust holes 341E having the same size in a region E of the cover plate 34, a set of sixth exhaust holes 341F having the same size in a region F of the cover plate 34, a set of seventh exhaust holes 341G having the same size in a region G of the cover plate 34, and a set of eighth exhaust holes 341H having the same size in a region H of the cover plate 34, in some embodiments. The five regions D, E, F, G and H are arranged in the first direction D1 and close to the edge X of the cover plate 34. In addition, the regions D, E, F, G and H are arranged in sequence in the direction away from the exhaust port 121.

In some embodiments, the size of each eighth exhaust hole 341H in the region H is larger than the size of each seventh exhaust hole 341G in the region G, the size of each seventh exhaust hole 341G in the region G is larger than the size of each sixth exhaust hole 341F in the region F, the size of each sixth exhaust hole 341F in the region F is larger than the size of each fifth exhaust hole 341E in the region E, and the size of each fifth exhaust hole 341E in the region E is larger than the size of each fourth exhaust hole 341D in the region D, as shown in FIG. 3.

For example, the size of each eighth exhaust hole 341H may be about 13 mm, the size of each seventh exhaust hole 341G may be about 11 mm, the size of each sixth exhaust hole 341F may be about 10 mm, the size of each fifth exhaust hole 341E may be about 9 mm, and the size of each fourth exhaust hole 341D may be about 7 mm, in some cases where the pumping pressure of the exhaust line 122 is about 1.4 kpa. Alternatively, the size of each eighth exhaust hole 341H may be about 16 mm, the size of each seventh exhaust hole 341G may be about 13 mm, the size of each sixth exhaust hole 341F may be about 12 mm, the size of each fifth exhaust hole 341E may be about 11 mm, and the size of each fourth exhaust hole 341D may be about 8.4 mm, in some cases where the pumping pressure of the exhaust line 122 is in a range from about 1.4 to 1.7 kpa. Alternatively, the size of each eighth exhaust hole 341H may be about 20 mm, the size of each seventh exhaust hole 341G may be about 18.7 mm, the size of each sixth exhaust hole 341F may be about 17 mm, the size of each fifth exhaust hole 341E may be about 14.5 mm, and the size of each fourth exhaust hole 341D may be about 11.2 mm, in some cases where the pumping pressure of the exhaust line 122 is in a range from about 1.7 to 4.2 kpa.

In some embodiments, the fourth exhaust holes 341D in the region D have a uniform (hole) pitch S4 between adjacent fourth exhaust holes 341D in the first direction D1, the fifth exhaust holes 341E in the region E have a uniform (hole) pitch S5 between adjacent fifth exhaust holes 341E in the first direction D1, the sixth exhaust holes 341F in the region F have a uniform (hole) pitch S6 between adjacent sixth exhaust holes 341F in the first direction D1, the seventh exhaust holes 341G in the region G have a uniform (hole) pitch S7 between adjacent seventh exhaust holes 341G in the first direction D1, and the eighth exhaust holes 341H in the region H have a uniform (hole) pitch S8 between adjacent eighth exhaust holes 341H in the first direction D1, as shown in FIG. 3. The pitch S4 is smaller than the pitch S5, the pitch S5 is smaller than the pitch S6, the pitch S6 is smaller than the pitch S7, and the pitch S7 is smaller than the pitch S8. For example, the pitch S4 may be about 12 mm, the pitch S5 may be about 14 mm, the pitch S6 may be about 24 mm, the pitch S7 may be about 26 mm, and the pitch S8 may be about 36 mm, in some cases.

As shown in FIG. 3, the exhaust holes 341 further comprise a set of ninth exhaust holes 341I having the same size in a region I of the cover plate 34, a set of tenth exhaust holes 341J having the same size in a region J of the cover plate 34, and a set of eleventh exhaust holes 341K having the same size in a region K of the cover plate 34, in some embodiments. The three regions I, J and K are arranged in the first direction D1 and arranged in sequence in the direction away from the exhaust port 121. In addition, in the second direction D2, the region I is between the regions A and D, the region J is between the regions B and F, and the region K is between the regions C and G.

In some embodiments, the size of each eleventh exhaust hole 341K in the region K is larger than the size of each tenth exhaust hole 341J in the region J, and the size of each tenth exhaust hole 341J in the region J is larger than the size of each ninth exhaust hole 341I in the region I, as shown in FIG. 3.

For example, the size of each eleventh exhaust hole 341K may be about 10 mm, the size of each tenth exhaust hole 341J may be about 8 mm, and the size of each ninth exhaust hole 341I may be about 5 mm, in some cases where the pumping pressure of the exhaust line 122 is about 1.4 kpa. Alternatively, the size of each eleventh exhaust hole 341K may be about 12 mm, the size of each tenth exhaust hole 341J may be about 8.5 mm, and the size of each ninth exhaust hole 341I may be about 6.2 mm, in some cases where the pumping pressure of the exhaust line 122 is in a range from about 1.4 to 1.7 kpa. Alternatively, the size of each eleventh exhaust hole 341K may be about 17 mm, the size of each tenth exhaust hole 341J may be about 12 mm, and the size of each ninth exhaust hole 341I may be about 8 mm, in some cases where the pumping pressure of the exhaust line 122 is in a range from about 1.7 to 4.2 kpa.

In some embodiments, the ninth exhaust holes 341I in the region I have a uniform (hole) pitch S9 between adjacent ninth exhaust holes 341I in the first direction D1, the tenth exhaust holes 341J in the region J have a uniform (hole) pitch S10 between adjacent tenth exhaust holes 341J in the first direction D1, and the eleventh exhaust holes 341K in the region K have a uniform (hole) pitch S11 between adjacent eleventh exhaust holes 341K in the first direction D1, as shown in FIG. 3. The pitch S9 is smaller than the pitch S10, and the pitch S10 is smaller than the pitch S11. For example, the pitch S9 may be about 12 mm, the pitch S10 may be about 24 mm, and the pitch S11 may be about 36 mm, in some cases.

In some embodiments, the regions A, I and D are arranged along the second direction D2 and arranged in sequence in the direction away from the exhaust port 121, as shown in FIG. 3. In some embodiments, the size of each fourth exhaust hole 341D in the region D is larger than the size of each ninth exhaust hole 341I in the region I, and the size of each ninth exhaust hole 341I in the region I is larger than the size of each first exhaust hole 341A in the region A. Examples of the exhaust holes 341A, 341D and 341I sizes have been discussed above and are not repeated here.

In some embodiments, the first exhaust holes 341A in the region A have a uniform (hole) pitch S1' between adjacent first exhaust holes 341A in the second direction D2, and the ninth exhaust holes 341I in the region I have a uniform (hole) pitch S9' between adjacent ninth exhaust holes 341I in the second direction D2, as shown in FIG. 3. The pitch S1' is smaller than the pitch S9'. For example, the pitch S1' may be about 12 mm and the pitch S9' may be 24 mm, in some cases.

In some embodiments, the regions B, J and F are arranged along the second direction D2 and arranged in sequence in the direction away from the exhaust port 121, as shown in FIG. 3. In some embodiments, the size of each sixth exhaust hole 341F in the region F is larger than the size of each tenth exhaust hole 341J in the region J, and the size of each tenth exhaust hole 341J in the region J is larger than the size of each second exhaust hole 341B in the region B. Examples of the exhaust holes 341B, 341F and 341J sizes have been discussed above and are not repeated here.

In some embodiments, the second exhaust holes 341B in the region B have a uniform (hole) pitch S2' between adjacent second exhaust holes 341B in the second direction D2, and the tenth exhaust holes 341J in the region J have a uniform (hole) pitch S10' between adjacent tenth exhaust holes 341J in the second direction D2, as shown in FIG. 3. The pitch S2' is smaller than the pitch S10'. For example, the pitch S2' may be about 12 mm and the pitch S10' may be 24 mm, in some cases.

In some embodiments, the regions C, K, G and H are arranged along the second direction D2 and arranged in sequence in the direction away from the exhaust port 121, as shown in FIG. 3. In some embodiments, the size of each eighth exhaust hole 341H in the region H is larger than the size of each seventh exhaust hole 341G in the region G, the size of each seventh exhaust hole 341G in the region G is larger than the size of each eleventh exhaust hole 341K in the region K, and the size of each eleventh exhaust hole 341K in the region K is larger than the size of each third exhaust hole 341C in the region C. Examples of the exhaust holes 341C, 341K, 341G and 341H sizes have been discussed above and are not repeated here.

In some embodiments, the third exhaust holes 341C in the region C have a uniform (hole) pitch S3' between adjacent third exhaust holes 341C in the second direction D2, and the seventh exhaust holes 341G in the region G have a uniform (hole) pitch S7' between adjacent seventh exhaust holes 341G in the second direction D2, as shown in FIG. 3. The pitch S3' is smaller than the pitch S7'. For example, the pitch S3' may be about 12 mm and the pitch S7' may be 24 mm, in some cases.

In some embodiments, the regions A, J, G and H are arranged along a diagonal direction D3 substantially from a location of the cover plate 34 near the exhaust port 121 toward a corner of the cover plate 34 close to the region H and are arranged in sequence in the direction away from the exhaust port 121, as shown in FIG. 3. In some embodiments, the size of each eighth exhaust hole 341H in the region H is larger than the size of each seventh exhaust hole 341G in the region G, the size of each seventh exhaust hole 341G in the region G is larger than the size of each tenth exhaust hole 341J in the region J, and the size of each tenth exhaust hole 341J in the region J is larger than the size of each first exhaust hole 341A in the region A. Examples of the exhaust holes 341A, 341J, 341G and 341H sizes have been discussed above and are not repeated here.

It should be understood that the geometries described herein are only illustrative, and are not intended to be, and should not be constructed to be, limiting to the present disclosure. Many alternatives and modifications will be apparent to those skilled in the art, once informed by the present disclosure. For example, the shape, arrangement, and/or pattern of the exhaust holes 341 over the cover plate 34 may also be changed in different embodiments.

In the above embodiments, the size of the exhaust holes 341 farther from the exhaust port 121 is larger than the size of the exhaust holes 341 closer to the exhaust port 121, so that the wind speed for the exhaust holes 341 farther from the exhaust port 121 is increased. Further, because larger exhaust holes 341 also have larger hole pitch, mutual interference of airflow from these exhaust holes can be reduced or prevented. Accordingly, a more uniform exhaust flow field distribution is obtained using the cover plate 34 discussed above, and photoresist volatiles can be smoothly taken away by the airflow and have less chance of attaching to the cover plate 34. As a result, the frequency of cleaning the cover plate 34 is reduced, and the risk of wafer defects can also be reduced.

Figure 4:
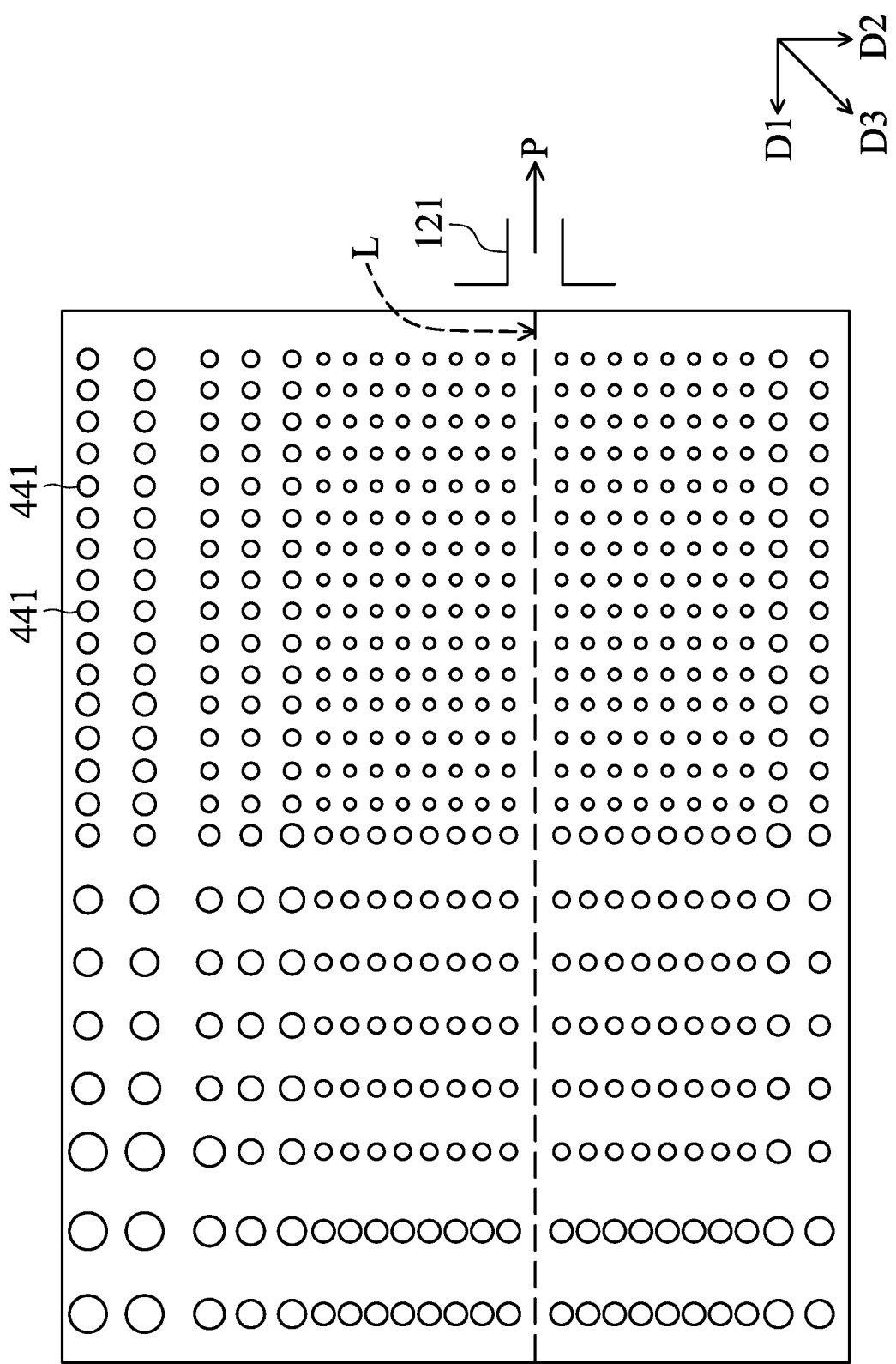
FIG. 4 is a schematic top view of a cover plate with an uneven exhaust hole distribution, in accordance with some embodiments.

FIG. 4 is a schematic top view of a cover plate 44 for facilitating a more uniform exhaust flow field distribution, in accordance with some other embodiments. The cover plate 44 may be disposed in the baking chamber BC of the photoresist baking apparatus 10 in a similar manner to the cover plate 14 illustrated in FIG. 1B. Also, the structure, materials, and formation method of the cover plate 44 may be the same or similar to those of the cover plate 14 illustrated in FIG. 1B. Unlike the cover plate 34 illustrated in FIG. 3, since the exhaust port 121 is offset from the center line L of the cover plate 44 in the present embodiment, the exhaust holes 441 are asymmetrically arranged with respect to the center line L, as shown in FIG. 4. The cover plate 44 also improves the uniformity of the wind speed of the exhaust holes 441 through an uneven exhaust hole distribution, for example, by arranging for the exhaust holes 441 farther from the exhaust port 121 to be larger than the exhaust holes 441 closer to the exhaust port 121 and/or by arranging for larger exhaust holes 441 to have a larger hole pitch, similar to the cover plate 34 discussed above.

Embodiments of the disclosure provide a photoresist baking apparatus including an improved cover plate. The cover plate is placed in the baking chamber and between the hot plate and the exhaust port to allow air to flow evenly throughout the baking chamber which provides for a uniform film topography on the wafer surface. In response to the exhaust port being close to one side of the cover plate in some embodiments, the exhaust holes on the cover plate are designed in such a way that the exhaust holes farther from the exhaust port are larger than the exhaust holes closer to the exhaust port, and/or the larger exhaust holes have a larger hole pitch, so as to improve the uniformity of the wind speed of the exhaust holes. As such, photoresist volatiles have less chance of attaching to the cover plate, and therefore the frequency of cleaning the cover plate can be reduced and the risk of wafer defects is also reduced.

In accordance with some embodiments, a photoresist baking apparatus is provided. The photoresist baking apparatus includes a baking chamber, a hot plate disposed in the baking chamber, and a cover plate disposed over the hot plate. The cover plate has a plurality of exhaust holes. The exhaust holes include a first exhaust hole and a second exhaust hole arranged in a first direction. The first exhaust hole and the second exhaust hole have different sizes.

In accordance with some embodiments, a photoresist baking apparatus is provided. The photoresist baking apparatus includes a baking chamber, a hot plate disposed in the baking chamber, and a cover plate disposed over the hot plate. The cover plate has a plurality of exhaust holes. The exhaust holes include a set of first exhaust holes and a set of second exhaust holes, the set of the first exhaust holes each has a first size, the set of the second exhaust holes each has a second size less than the first size, the set of first exhaust holes position at a first region, the set of second exhaust holes position at a second region, and the area of the first region is greater than the area of the second region.

In accordance with some embodiments, a photoresist baking apparatus is provided. The photoresist baking apparatus includes a baking chamber, a hot plate disposed in the baking chamber, and a cover plate disposed over the hot plate. The cover plate has a plurality of exhaust holes. The exhaust holes include a set of first exhaust holes, a set of second exhaust holes, and a set of third exhaust holes, the set of first exhaust holes are at a first region, the set of second exhaust holes are at a second region, and the set of third exhaust holes are at a third region. A first portion of the second region extends between the first region and the third region, a second portion of the second region arranges with the first region in a first direction, and the second portion of the second region arranges with the third region in a second direction different from the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photoresist baking apparatus, comprising:
   a baking chamber having an exhaust port;
   a hot plate disposed in the baking chamber;
   an exhaust line coupled to the exhaust port and extending in a first direction; and
   a cover plate disposed over the hot plate, wherein the cover plate has a plurality of exhaust holes,
   wherein the exhaust holes comprise a first exhaust hole and a second exhaust hole arranged in a second direction different from the first direction, wherein the first exhaust hole is closer to the exhaust port than the second exhaust hole, and a size of the first exhaust hole is less than a size of the second exhaust hole.

2. The photoresist baking apparatus as claimed in claim 1, wherein the exhaust holes further comprises a third exhaust hole, wherein the first exhaust hole and the third exhaust hole are arranged in a third direction different from the second direction.

3. The photoresist baking apparatus as claimed in claim 2, wherein the exhaust holes further comprises a fourth exhaust hole, wherein the second exhaust hole and the fourth exhaust hole are arranged in the second direction, the third exhaust hole and the fourth exhaust hole are arranged in the third direction.

4. The photoresist baking apparatus as claimed in claim 3, wherein the size of the second exhaust hole is less than the size of the fourth exhaust hole, and the size of the third exhaust hole is less than the size of the fourth exhaust hole.

5. The photoresist baking apparatus as claimed in claim 3, wherein the exhaust holes further comprises a fifth exhaust hole, and the second exhaust hole, the fourth exhaust hole, and the fifth exhaust hole are arranged sequentially in the second direction, wherein the size of the fifth exhaust hole is greater than the size of the second exhaust hole or the fourth exhaust hole.

6. The photoresist baking apparatus as claimed in claim 5, wherein the exhaust holes further comprises a sixth exhaust hole, and the sixth exhaust hole, the third exhaust hole, and the fourth exhaust hole are arranged sequentially in the second direction, wherein the size of the third exhaust hole is less than the size of the sixth exhaust hole and the size of the fourth exhaust hole.

7. The photoresist baking apparatus as claimed in claim 6, wherein the size of the fifth exhaust hole is greater than the size of the sixth exhaust hole.

8. The photoresist baking apparatus as claimed in claim 6, wherein a center line extended in an exhaust direction passes the exhaust line, and the first exhaust hole and the sixth exhaust hole are arranged in different sides of the center line.

9. A photoresist baking apparatus, comprising:
   a baking chamber having an exhaust port on a sidewall of the baking chamber;
   a hot plate disposed in the baking chamber; and
   a cover plate disposed over the hot plate, wherein the cover plate has a plurality of exhaust holes,
   wherein the exhaust holes comprise a set of first exhaust holes and a set of second exhaust holes, the set of the first exhaust holes each has a first size, the set of the second exhaust holes each has a second size less than the first size, the set of first exhaust holes position at a first region, the set of second exhaust holes position at a second region, and the area of the first region is greater than the area of the second region, and the first region is closer to the exhaust port than the second region.

10. The photoresist baking apparatus as claimed in claim 9, wherein the exhaust holes further comprises a set of third exhaust holes, the set of the third exhaust holes, the set of first exhaust holes, and the set of the second exhaust holes arranged sequentially in a first direction, the set of the third exhaust holes are in a third region, and the size of the third region is greater than the size of the second region.

11. The photoresist baking apparatus as claimed in claim 10, wherein the exhaust holes further comprises a set of fourth exhaust holes position at a fourth region and a set of fifth exhaust holes position at a fifth region, wherein the second region and the fourth region are arranged in the first direction, the second region and the fifth region are arranged in the first direction, and the fourth region and the fifth region are arranged in a second direction that is perpendicular to the first direction.

12. The photoresist baking apparatus as claimed in claim 11, wherein the set of fourth exhaust holes each has a fourth size, the set of fifth exhaust holes each has a fifth size, and the fourth size and the fifth size are different.

13. The photoresist baking apparatus as claimed in claim 12, wherein in the second direction, the length of the first region is greater than the length of the fourth region or the length of the fifth region, and the length of the first region is less than the length of the fourth region plus the length of the fifth region.

14. The photoresist baking apparatus as claimed in claim 10, wherein the exhaust holes further comprises a set of sixth exhaust holes position at a sixth region, the second region and the sixth region are arranged in a second direction that is perpendicular to the first direction, the size of the set of sixth exhaust holes is greater than the size of the set of third exhaust holes.

15. The photoresist baking apparatus as claimed in claim 14, wherein the pitch between the set of sixth exhaust holes is greater than the pitch between the set of second exhaust holes.

16. A photoresist baking apparatus, comprising:
   a baking chamber having an exhaust port;
   a hot plate disposed in the baking chamber; and
   a cover plate disposed over the hot plate, wherein the cover plate has a plurality of exhaust holes,
   wherein the exhaust holes comprise a set of first exhaust holes, a set of second exhaust holes, and a set of third exhaust holes, the set of first exhaust holes are at a first region, the set of second exhaust holes are at a second region, and the set of third exhaust holes are at a third region, wherein a first portion of the second region extends between the first region and the third region, a second portion of the second region arranges with the first region in a first direction, and the second portion of the second region arranges with the third region in a second direction different from the first direction, wherein a distance between the first region and the exhaust port is less than a distance between the third region and the exhaust port, and sizes of the first exhaust holes is less than sizes of the third exhaust holes.

17. The photoresist baking apparatus as claimed in claim 16, wherein the exhaust holes further comprise a set of fourth exhaust holes, and the set of fourth exhaust holes and the set of second exhaust holes are arranged in the first direction, wherein the size of the fourth exhaust holes is greater than the size of the second exhaust holes.

18. The photoresist baking apparatus as claimed in claim 17, wherein the exhaust holes further comprise a set of fifth exhaust holes at a fifth region, wherein a first portion of the fifth region extends between the second region and the fourth region, and the size of the set of fifth exhaust holes is different from the size of the set of third exhaust holes.

19. The photoresist baking apparatus as claimed in claim 18, wherein the first portion of the fifth region and the first region are arranged in the second direction, and a second portion of the fifth region and the first region are arranged in the first direction.

20. The photoresist baking apparatus as claimed in claim 18, wherein the size of the set of fifth exhaust holes is greater than the size of the set of fourth exhaust holes.

* * * * *